US006285548B1

(12) United States Patent
Hamlet et al.

(10) Patent No.: US 6,285,548 B1
(45) Date of Patent: Sep. 4, 2001

(54) FACE PLATE FOR A CHASSIS FOR HIGH FREQUENCY COMPONENTS

(75) Inventors: Darrel J. Hamlet, Upton; Eric G. Franklin, Stoneham, both of MA (US)

(73) Assignee: Quantum Bridge Communications, Inc., Andover, MA (US)

( * ) Notice: Subject to any disclaimer, the term of this patent is extended or adjusted under 35 U.S.C. 154(b) by 0 days.

(21) Appl. No.: 09/642,166

(22) Filed: Aug. 18, 2000

(51) Int. Cl.$^7$ ................................................ H05K 7/20
(52) U.S. Cl. ................... 361/695; 361/688; 361/689; 361/690; 361/721; 361/759; 361/802; 361/818; 174/15.1; 174/16.1; 174/66; 174/67; 312/223.2; 439/79; 454/184
(58) Field of Search ...................... 361/683–690, 361/694, 695, 716, 721, 724, 726, 730, 732, 741, 752, 756, 759, 800, 801, 802, 816, 818; 174/16.1, 66, 67; 165/104.33; 439/79; 312/223.2; 454/184

(56) References Cited

U.S. PATENT DOCUMENTS

| Re. 34,955 | 5/1995 | Anton et al. ........................... 385/53 |
|---|---|---|
| D. 379,290 | 5/1997 | Joslin ....................................... D8/14 |
| 4,064,551 | 12/1977 | Lightfoot ............................... 361/399 |
| 4,092,699 | 5/1978 | Petrangelo ............................. 361/415 |
| 4,233,646 | 11/1980 | Leung et al. ........................... 361/399 |
| 4,313,150 | 1/1982 | Chu ......................................... 361/399 |
| 4,564,250 | 1/1986 | Klein et al. ......................... 339/14 R |
| 4,580,192 | 4/1986 | Beun ....................................... 361/395 |
| 4,603,375 | 7/1986 | Miller et al. ........................... 361/399 |
| 4,648,009 | 3/1987 | Beun et al. ............................. 361/399 |
| 4,716,497 | * 12/1987 | Craker .................................... 361/740 |
| 4,725,921 | 2/1988 | Scholz .................................... 361/392 |
| 4,840,570 | * 6/1989 | Mahnn, Jr. et al. ..................... 439/74 |
| 4,996,631 | 2/1991 | Freehauf ................................ 361/415 |
| 5,011,257 | 4/1991 | Wettengel et al. ................... 350/96.2 |
| 5,216,578 | 6/1993 | Zenitani et al. ....................... 361/383 |
| 5,255,160 | 10/1993 | Iwatare et al. ........................ 361/798 |
| 5,267,658 | 12/1993 | Schwenk et al. ....................... 211/26 |
| 5,302,133 | 4/1994 | Tondreault ............................. 439/157 |
| 5,309,325 | 5/1994 | Dreher et al. ......................... 361/754 |
| 5,375,724 | 12/1994 | Mazura .................................... 211/26 |
| 5,402,319 | 3/1995 | Shumaker et al. ................... 361/796 |
| 5,406,455 | 4/1995 | Devenish, III ....................... 361/752 |
| 5,410,448 | * 4/1995 | Barker, III et al. ................... 361/695 |

(List continued on next page.)

*Primary Examiner*—Leo P. Picard
*Assistant Examiner*—Boris L. Chervinsky
(74) *Attorney, Agent, or Firm*—Hamilton, Brook, Smith & Reynolds, P.C.

(57) ABSTRACT

An electronic chassis or modular rack has elements and methods for reducing emission of electromagnetic waves or interference (EMI) and at the same time ensuring that the components within the chassis or rack are properly cooled. A face plate which attaches to a printed circuit board or blank board for insertion and removal of the board from the chassis and limiting EMI emission while allowing connector and indicator accessibility. The face plate has an elongated frame having at least two planar body portions. The planar body portions are integrally formed to each other with the planes of the two planar body portions at an angle of between 25 and 55 degrees of each other. The elongated frame has a pair of free edges adjacent to the planar surfaces and the pair of side edges. The face plate has a pair of mounting devices. Each mounting device is carried by the elongated frame in proximity to one of the free edges. The pair of mounting devices are offset from each other about the planar body portions. The air impedance module or board inserts into the chassis for controlling air flow in the chassis. The top and bottom edges are adapted to be received in the chassis. An air impedance protrusion is formed integrally with the planar portion adapted for limiting the flow of air. The limiting of the flow of air in one portion results in the air being redirected to printed circuit boards that have active components that need cooling.

32 Claims, 13 Drawing Sheets

U.S. PATENT DOCUMENTS

| | | | |
|---|---|---|---|
| 5,428,507 | 6/1995 | Chatel et al. | 361/798 |
| 5,432,674 * | 7/1995 | Hardt | 361/694 |
| 5,638,259 * | 6/1997 | McCarthy et al. | 361/800 |
| 5,669,512 | 9/1997 | Joslin | 211/41 |
| 5,680,294 | 10/1997 | Stora et al. | 361/695 |
| 5,708,742 | 1/1998 | Beun et al. | 385/53 |
| 5,724,467 | 3/1998 | vandenEnden et al. | 385/134 |
| 5,781,417 | 7/1998 | Albani et al. | 361/801 |
| 5,793,614 | 8/1998 | Tollbom | 361/732 |
| 5,801,926 | 9/1998 | Cutsforth et al. | 361/754 |
| 5,930,120 | 7/1999 | Gunther et al. | 361/800 |
| 5,945,633 | 8/1999 | Ott et al. | 174/59 |
| 5,946,196 | 8/1999 | Baek | 361/798 |
| 5,978,233 | 11/1999 | Roscoe et al. | 361/796 |
| 5,999,411 * | 12/1999 | Patel | 361/759 |
| 6,003,689 | 12/1999 | Babineau et al. | 211/41.17 |
| 6,160,717 * | 12/2000 | Desousa et al. | 361/798 |
| 6,172,880 * | 1/2001 | Petitpierre et al. | 361/801 |
| 6,185,106 * | 2/2001 | Mueller | 361/798 |

* cited by examiner

FACE PLATE FOR A CHASSIS FOR HIGH FREQUENCY COMPONENTS

BACKGROUND OF THE INVENTION

Electrical components generate an electromagnetic field when the electrical components are in an activated state. This electromagnetic field can be generated by an act as simple as a current passing through a wire. However, the concern related to the electromagnetic field creating interference is typically related to complex circuitry. This electromagnetic field generated by one component can interfere with the workings of other components in proximity to it. With this concern, various groups and organizations such as the Federal Communications Commission establish requirements regarding the emission of electromagnetic waves or fields from components or units, such as chassises. This emission of electromagnetic waves is typically referred to as electromagnetic interference or EMI.

It is known to create a metal cage surrounding the components to block or "knock down" the radiating electromagnetic waves. As the frequency within the circuitry increases the wavelength decreases, therefore the size of the opening through which the electromagnetic wave can exit the chassis is decreased. For example, as the frequency approaches 622 MHz, the size of the opening through which a wave may pass is in the range of 2 inches. While the height of the wave depends on the frequency, the width or thickness of the wave is infinitesimal. Therefore, while the opening needs to be approximately 2 inches in height for the frequency of approximately 622 MHZ to pass through, the opening could be the thickness of this paper and the wave could pass through.

While there is a desire to reduce the size of openings in the chassis containing the electronic components, there is still a need to access the components and a need to replace components or interchange components as desired. It is known to have a series of panels or plates, such as face plates, which are removable to grant access to a component such as a printed circuit board located within the unit. In addition, the face plate may include openings to allow connectors to be accessible and indicators, such as lights, to be visible from the outside of the unit.

In addition to the desire to limit the emission of electromagnetic waves from the component, there is a desire or need to expel heat from the unit. It is therefore a balance of apparently opposing goals to allow sufficient airflow through the unit to allow proper cooling while at the same time preventing the emission of electromagnetic waves.

SUMMARY OF THE INVENTION

The invention relates to an electronic chassis or modular rack having elements and methods for reducing emission of electromagnetic waves or interference (EMI) and at the same time ensuring that the components within the chassis or rack are properly cooled and accessible.

The invention relates to a face plate which attaches to a printed circuit board or blank board for insertion and removal of the board from the chassis and limiting EMI emission while allowing connector and indicator accessibility.

The invention relates to an air impedance module or board for limiting air flow therein allowing redirection of the flow.

The face plate according to the invention has an elongated frame having at least two planar body portions. Each planar portion has a pair of planar surfaces and a pair of side edges. The planar body portions are integrally formed to each other with the planes of the two planar body portions at an angle of between 25 and 55 degrees of each other. The elongated frame has a pair of free edges adjacent to the planar surfaces and the pair of side edges. The face plate has a pair of mounting devices. Each mounting device is carried by the elongated frame in proximity to one of the free edges. The pair of mounting devices are offset from each other in parallel planes parallel to one of the planar body portions.

In a preferred embodiment, the face plate has a plurality of mounting bosses or printed circuit mounts carried on the inner surface of the planar body portions for attachment to a front edge of a printed circuit board. The mounting devices include at least one ejector pivotably mounted to the face plate adapted for seating and securing the face plate to a chassis. The planar portion of the elongated frame has an integral protrusion on the outer surface for pivotably receiving the ejector.

In a preferred embodiment, the face plate has an opening on one of the planar body portions adapted to receive an optical interface. In a preferred embodiment, the optical interface is an optical transceiver.

In a preferred embodiment, the elongated frame of the face plate is die cast. The planar portion of the elongated frame has an integral die cast protrusion on the outer surface for pivotably mounting an ejector adapted for seating and securing the face plate to a chassis. One of the side edges of the elongated frame has a flange with a groove. The groove receives a metallic seal adapted to seal with an adjacent surface.

The invention relates to a board for insertion in a chassis for controlling air flow in the chassis. The board has a planar portion having a pair of sides and a plurality of edges. The top and bottom edges are adapted to be received in the chassis. An air impedance protrusion is formed integrally with the planar portion and is adapted for limiting the flow of air. The limiting of the flow of air in one portion results in the air being redirected to the printed circuit boards that have active components that need to be cooled.

In a preferred embodiment, the air impedance board has a plurality of air impedance protrusions formed integrally with the planar portion of the chassis and protruding from the planar portion on the same side for limiting the flow of air. The board has a stiffener protrusion projecting generally non-parallel to the air impedance protrusion.

In a preferred embodiment, the air impedance board is formed of a flame retardant thermoplastic such as Kydex-T. In a preferred embodiment, the electronic chassis has a fan tray with a plurality of slots underlying the fan blades to allow air to flow through and is solid under the hub for fire protection purposes.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE INVENTION

Figure 1:
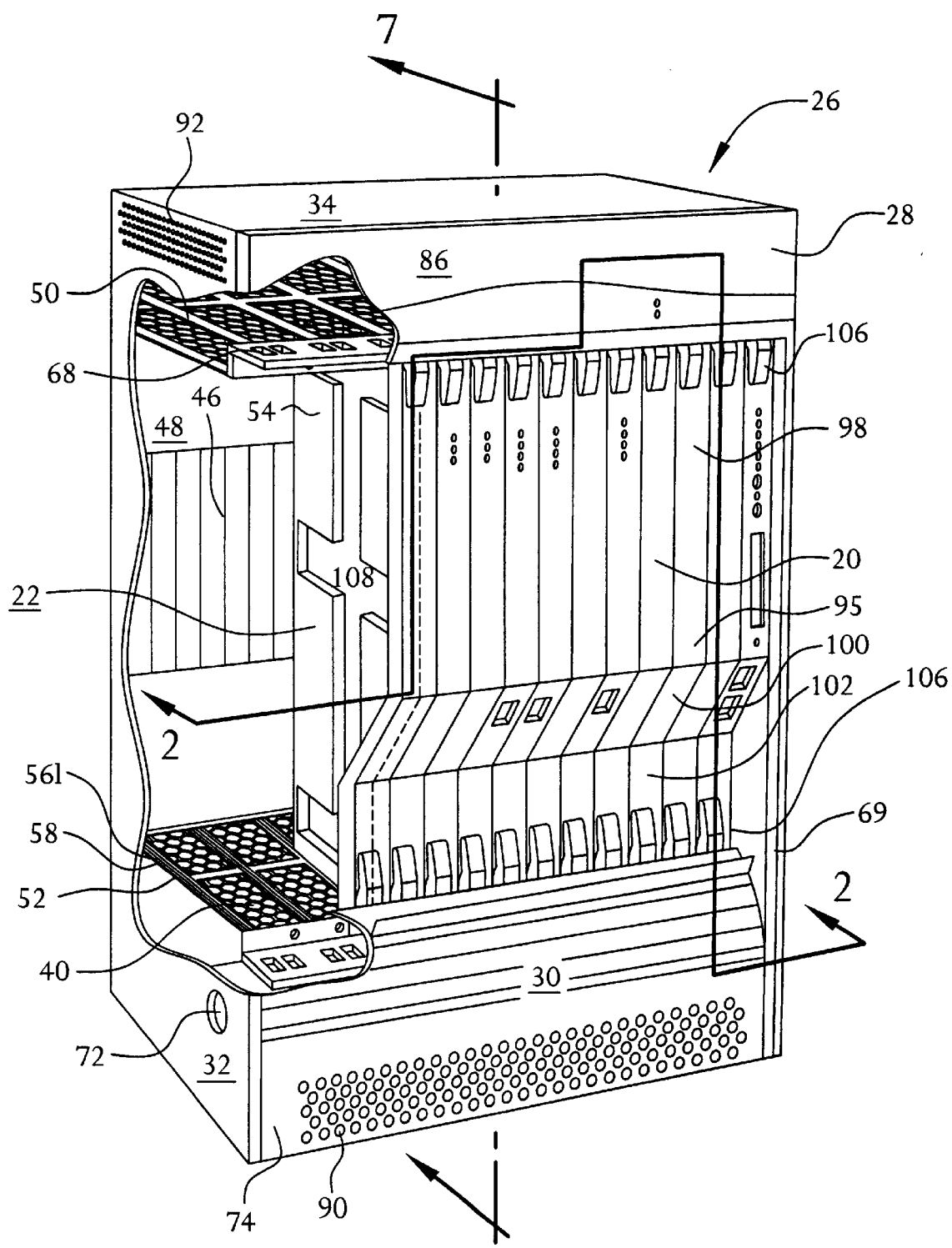
FIG. 1 is a left front perspective view of a modular rack, switching box, with portions broken away.

In the figures, like numbers are used to indicate like elements. FIG. 1 shows a modular rack with a face plate 20 and an air impedance module 22 of the invention.

Referring to FIG. 1, the modular rack 26 in a preferred embodiment is for use in optical switching. It is recognized that the invention as described can be used for other systems such as conventional copper wire and integrated circuit switching systems, transceiver units, processing units, or other units or systems.

Figure 2:
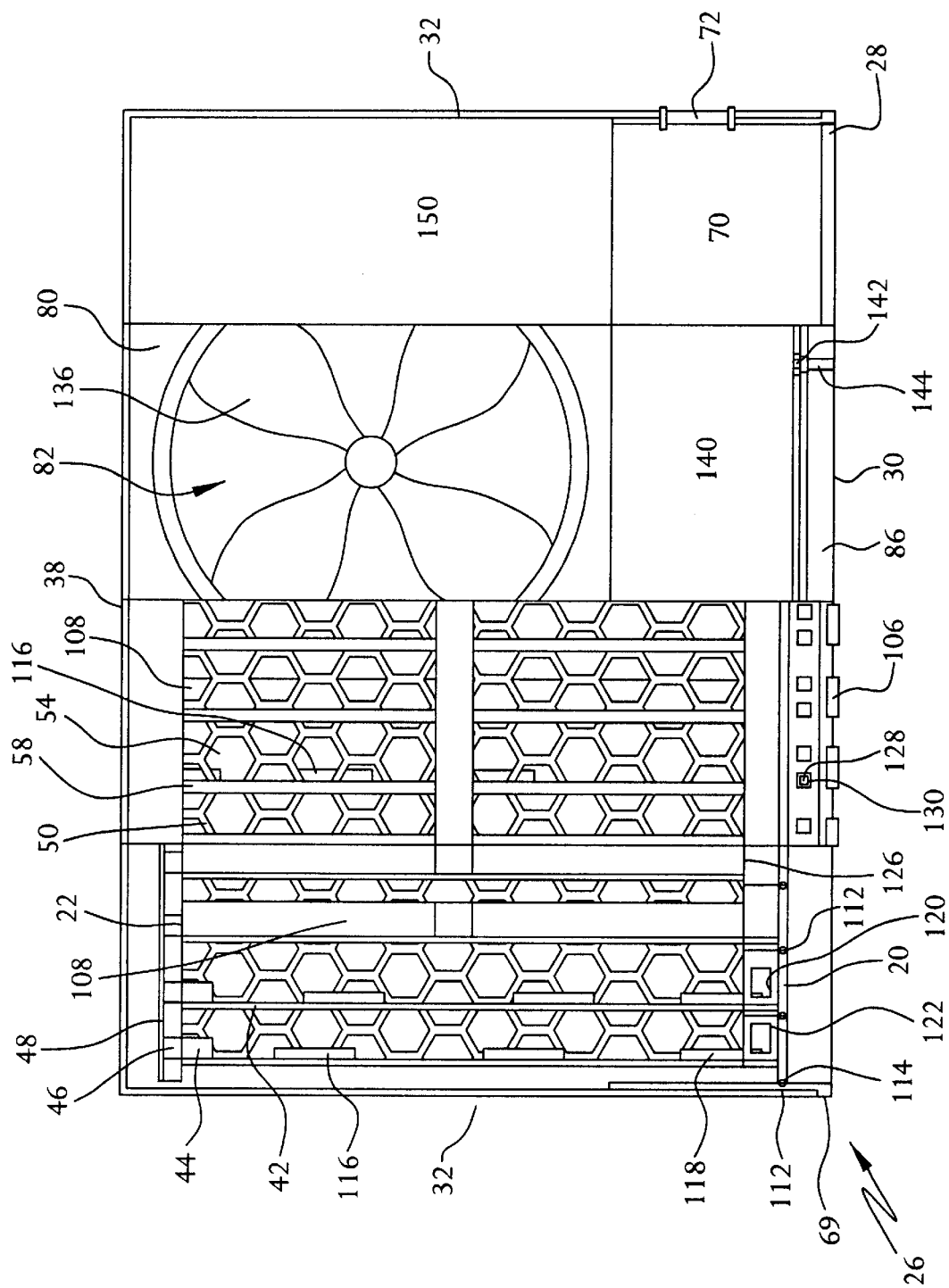
FIG. 2 is a sectional view of the modular rack taken along line 2—2 of FIG. 1.

The modular or mounting rack 26 has a housing 28 with a front 30, a pair of sides 32, a top 34, a base, and a back 38, as seen in FIG. 2. The front 30 has an opening 40 adapted to receive printed circuit boards (PCB) 42, as seen in FIG. 2, into the housing 28 of the module rack 26. The PCB 42 has an interface 44, such as a High Density Metric (HDM) female module sold by Molex, which is adapted to be received by an interface 46, such as a HDM male backplane connector sold by Molex, located on a backplate 48 carried within the modular rack 26.

Figure 5:
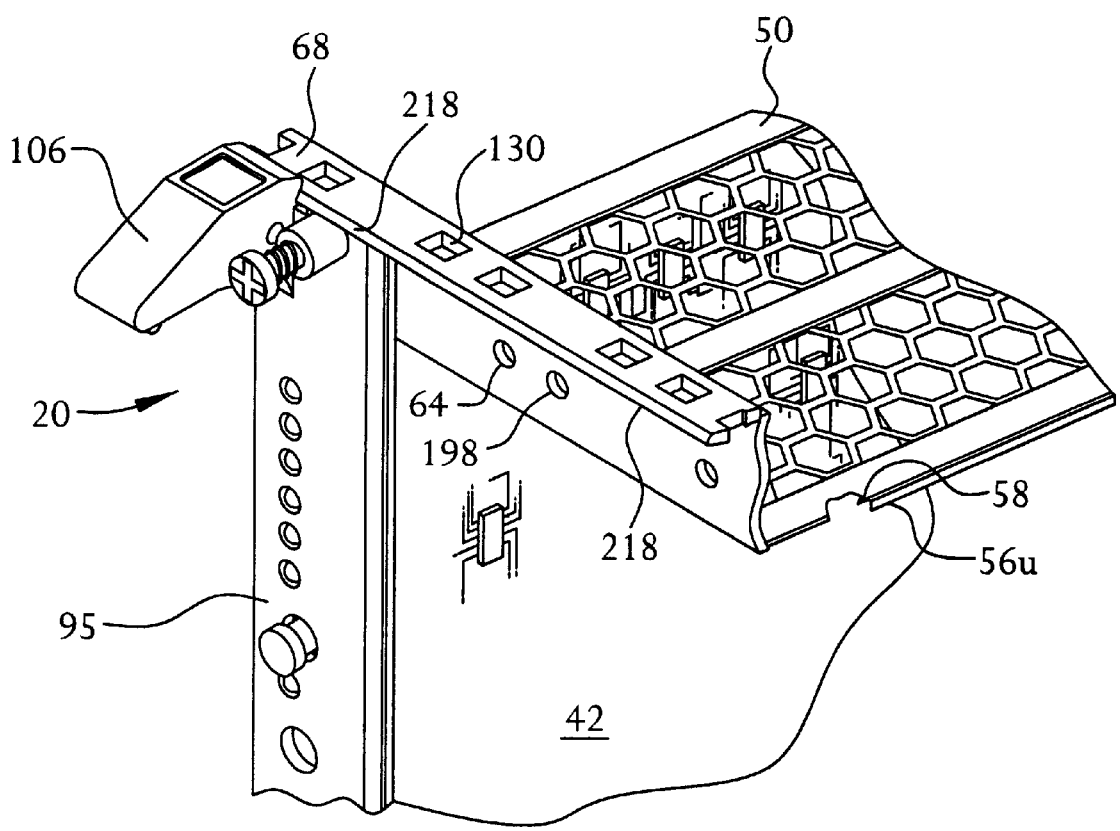
FIG. 5 is a right front perspective view of the ejector handle in an open position relative to the rail.

The modular rack 26 has upper and lower card guides 50 and 52 each formed of metal in a preferred embodiment. Each card guide 50 and 52 has numerous openings 54 through which air can pass as described in additional detail below. In addition, the upper card guide 50 and the lower card guide 52 each have formed within an upper rail 56u, as seen in FIG. 5, and a lower rail 56l respectively. The rails 56 each define a channel 58, a guide channel, to receive the upper and lower edge of the PCB as installed.

Figure 6:
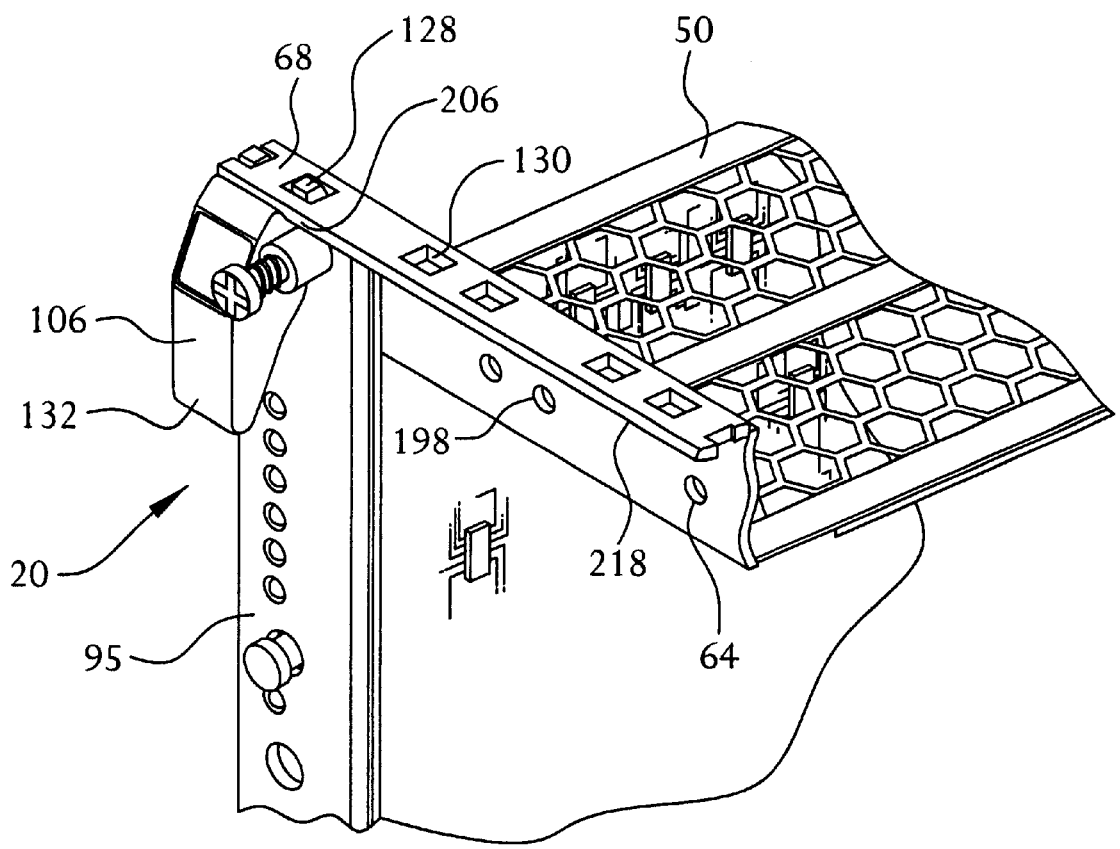
FIG. 6 is a right front perspective view similar to FIG. 5 with the ejector handle in a closed position relative to the rail.

The modular rack 26 has a pair of anchor surfaces 62, also referred to as stop plates. The anchor surfaces 62 are abutted by the face plates 20 when the face plates 20 are installed. The anchor surfaces 62 each have a plurality of threaded openings 64, as best seen in FIGS. 5 and 6, used in securing the face plates 20 as described below. In a preferred embodiment, the anchor surfaces 62 are formed as part of the card guides 50 and 52.

The modular rack 26 has a pair of ejector rails 68, a upper ejector rail and a lower ejector rail. The ejector rails 68 are located along the upper edge and the lower edge of the opening 40 on the front 30 of the housing 28. While referred to as ejector rails 68, the rails are used for both injection and ejection of the face plate 20 as explained in further detail below. The ejector rails 68 are adjacent to the anchor surfaces 62. The plane of each of the ejector rails 68 is perpendicular to the plane of the respective anchor surfaces 62. The ejector rails 68 interact with the front panel 20 as described below.

In a preferred embodiment, the housing 28 is formed from sheet metal having a thickness of 0.062 inches. In order to stiffen the housing, especially around the opening 54, in addition to the card guides 50 and 52 and the ejection rails 68, the modular rack 26 has a pair of extruded aluminum side rails 69, which extend from the upper card guide 50 to the base of this housing.

Figure 7:
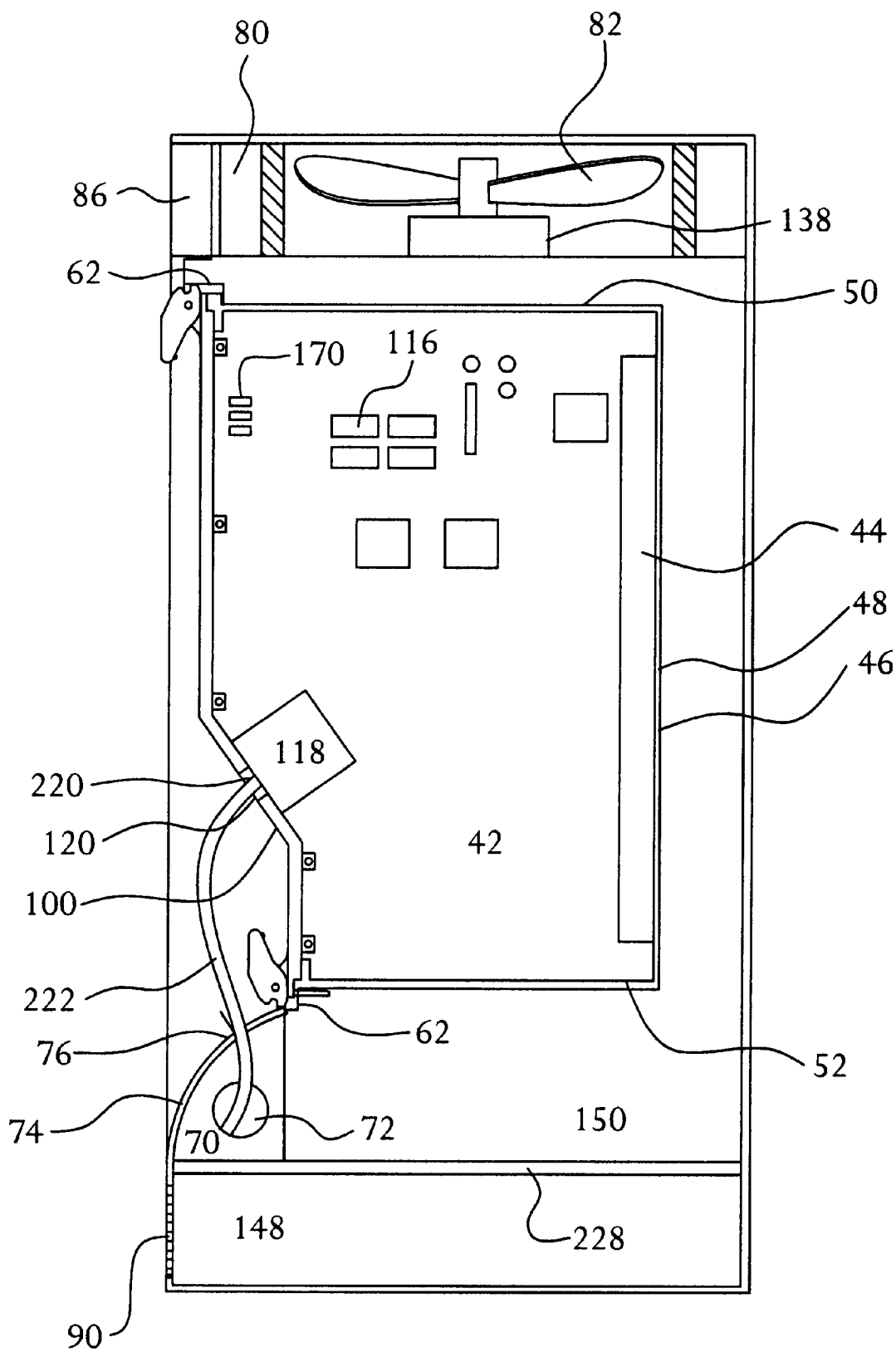
FIG. 7 is a side sectional view of the switching box with the circuit board installed and the cable routed.

The modular rack 26 has a cable or fiber management chamber 70, also referred to as cable channel or trough, and seen in FIGS. 2 and 7, which is accessible to a pair of openings 72, one seen in FIG. 1, located on the sides 32 of the housing 28. The front 30 of the housing 28 has a hinged panel 74 which opens to allow access to the cable channel 70. In addition, a plurality of slots 76, one seen in FIG. 7, located on the front panel 30 of the housing 28 of the modular rack 26 below the opening 40 allow access of cables into the cable channel 70.

Figure 8:
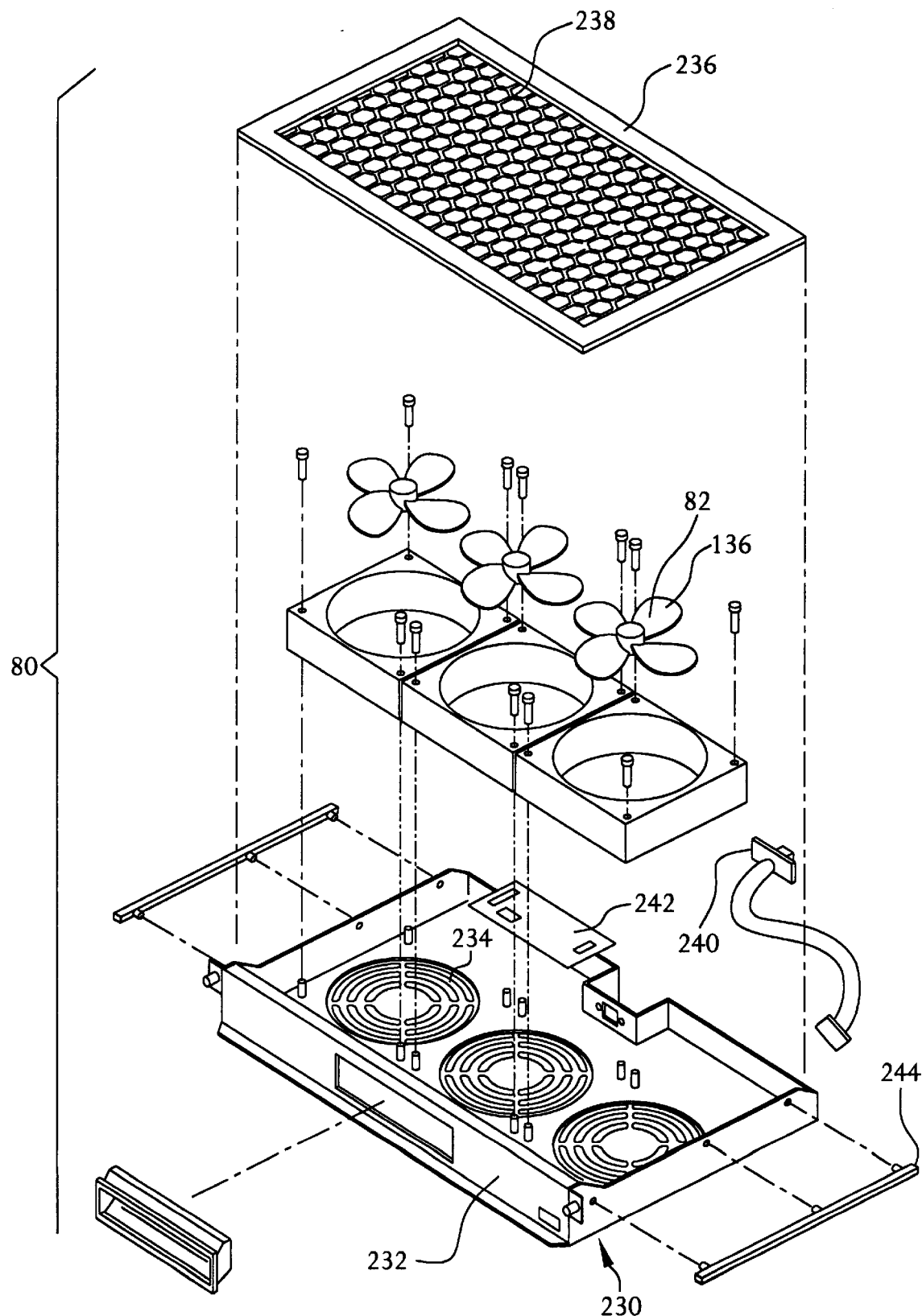
FIG. 8 is an exploded perspective view of a fan cage.

The upper portion of the housing 28 receives a fan casing or tray 80 containing a plurality of fans 82, as best seen in FIG. 8, for drawing air through the housing 28. The fan casing 80 is slid into an opening 84 in the front 30 of the housing 28 above the opening 40. The front of the fan casing 80 has a pair of optical LEDS for indicating the status of the fan. A fan faceplate or decorative bezel 86 is located in front of the fan casing 80.

The housing 28 of the modular rack 26 has a plurality of holes 90 located on the hinged panel 74 to the cable channel 70 and a plurality of holes 92 located on the sides 32 and the back 38 of the housing 28 of the modular rack 26 to allow airflow. The openings, which are holes 90 and 92 in the housing 28, are positioned such that all activated circuitry which would generate an electromagnetic field are not along a direct line of sight with such opening to the outside and any electromagnetic fields being generated needs to be redirected by at least one metal surface, therefore reducing the electromagnetic field prior to exiting the modular rack 26.

Still referring to FIG. 1, the face plate 20 has a frame 95 with a plurality of planar portions 96 and in a preferred embodiment has three planar portions 98, 100, and 102. In a preferred embodiment, the second planar portion 100 is integral with the other planar portions 98 and 102 and is angled between the two other planar portions 98 and 102 which are parallel but offset. The face plate 20 extends from one of the anchor surfaces 62 to the other anchor surface 62. The anchor surfaces 62 are parallel to each other, but offset from each other, as best seen in FIG. 7. Located at the ends of the face plate 20, the free ends of the planar portions 98 and 102 are the ejectors 106 which engage the ejector rails 68 as described in further detail below.

In certain situations the modular rack 26 does not require that each slot which is capable of receiving a printed circuit boards (PCB) 42 receive a PCB 42 with components. In these instances, instead of installing a blank PCB 42 with the face plate 20, an air impedance module 22 is installed with the face plate 20. Therefore, the modular rack 26 may have one or more of the air impedance modules 22. The air impedance modules 22 each have a plurality of protrusions 108 for limiting the air flow as further explained below.

FIG. 2 is a cross sectional view of the modular rack 26 showing sections of the modular rack 26 at various elevations in the rack 26 looking downward. The sections shown, looking left to right in FIG. 2, are at elevations through a mid-portion of the face plate 20, one of the two ejector rails 68, the fan tray or casing 80, and the cable channel or trough 70.

The first quarter of the figure shows three face plates 20 and a portion of a fourth face plate 20. A groove 112 in the housing 28 of the modular rack 26 receives a metallic seal 114 for engaging the first face plate 20. The first three face plates 20 each are shown with a groove 112 on the right side of the plate 20 for accepting the metallic seal 114 and engaging the adjacent face plate 20.

As indicated above, in a preferred embodiment a pair of extruded aluminum side rails 69 extend along the side of opening in the housing 28. The groove 112 in the housing 28 is in the side rail 69 as seen in FIG. 2.

A printed circuit board 42 is seen extending from the first and second face plates 20. Each of the circuit boards 42 has a plurality of components 116. The circuit boards 42 shown each have an optical transceiver 118 in proximity to the face plate 20 of their respective PCB 42. An opening 120 in the face plate 20 receives an adapter 122, such as a LC—LC duplex adapter, which allows fiber optic cabling to extend, in two segments, from the optical transceiver 118 through the interface 122 and extend outward and enter the cable channel or trough 70. The interface 44, such as a HDM module, of each of the PCBs 42 is accepted by a compatible interface 46, such as a HDM connector, on the backplate 48.

The third and fourth face plate 20 each are connected to a blank board which is one of the air impedance boards 22. The air impedance boards 22 each have an air impedance protrusion 108 which projects from a planar portion 126 to minimize the air gap to the adjacent printed circuit board 42 or blank air impedance board 22. The function of the air impedance board 22 with the air impedance protrusion 108 is explained in further detail below.

The second quarter of FIG. 2 shows a portion of a pair of teeth 128 of the ejectors 106 extending through holes 130 in the ejector rail 68. The teeth 128 and a back engaging surface 210 of the ejector 106 interact in moving the face plate 20 with the PCB 42 or the blank air impedance board 22 in and out of the housing 28. The ejector 106 has a handle portion 132, as best seen in FIGS. 3A–6, for assisting in the installation by rotating the ejector 106 as explained in further detail below. The upper card guide 50 with the plurality of openings 54 is seen from above with the channel 58. A few components 116 on a PCB 42 and an air impedance protrusion 108 on an air impedance board 22 can be seen through openings 54 in the upper card guide 50.

Still referring to FIG. 2, the third portion or quarter of the figure shows a section through the fan casing or tray 80. The fan casing or tray 80 has a plurality of fans 82, one seen in FIG. 2. In a preferred embodiment, the fan casing 80 has three fans 82 such as seen in FIG. 8. Each fan 82 has a plurality of blades 136 and is driven by a motor to draw air up through the housing 28 between the printed circuit boards 42 and the blank air impedance boards 22. The fan casing or tray 80 has a control unit 140 with a pair of LEDs (light emitting diodes) 142 for indicating the status of the fan casing or tray 80. The fan faceplate 86 covers the front of the fan casing or tray 80 and has a pair of light channels 144 for transmitting the light from the LEDs 142 to the front 30 of the modular rack 26.

The fourth portion of FIG. 2 is a section through the cable channel or trough 70. The cable channel 70 has openings 72 through the housing 28 at each side 32, one seen in FIG. 1 and the other in FIG. 2, for routing cables, also referred to as cabling, out of the cable channel 70. The cable channel 70 is above a duct 148; the duct 148 allows air to flow, as seen best seen in FIG. 7, to a plenum 150, seen in FIG. 2, located behind the cable channel 70.

Figure 3A:
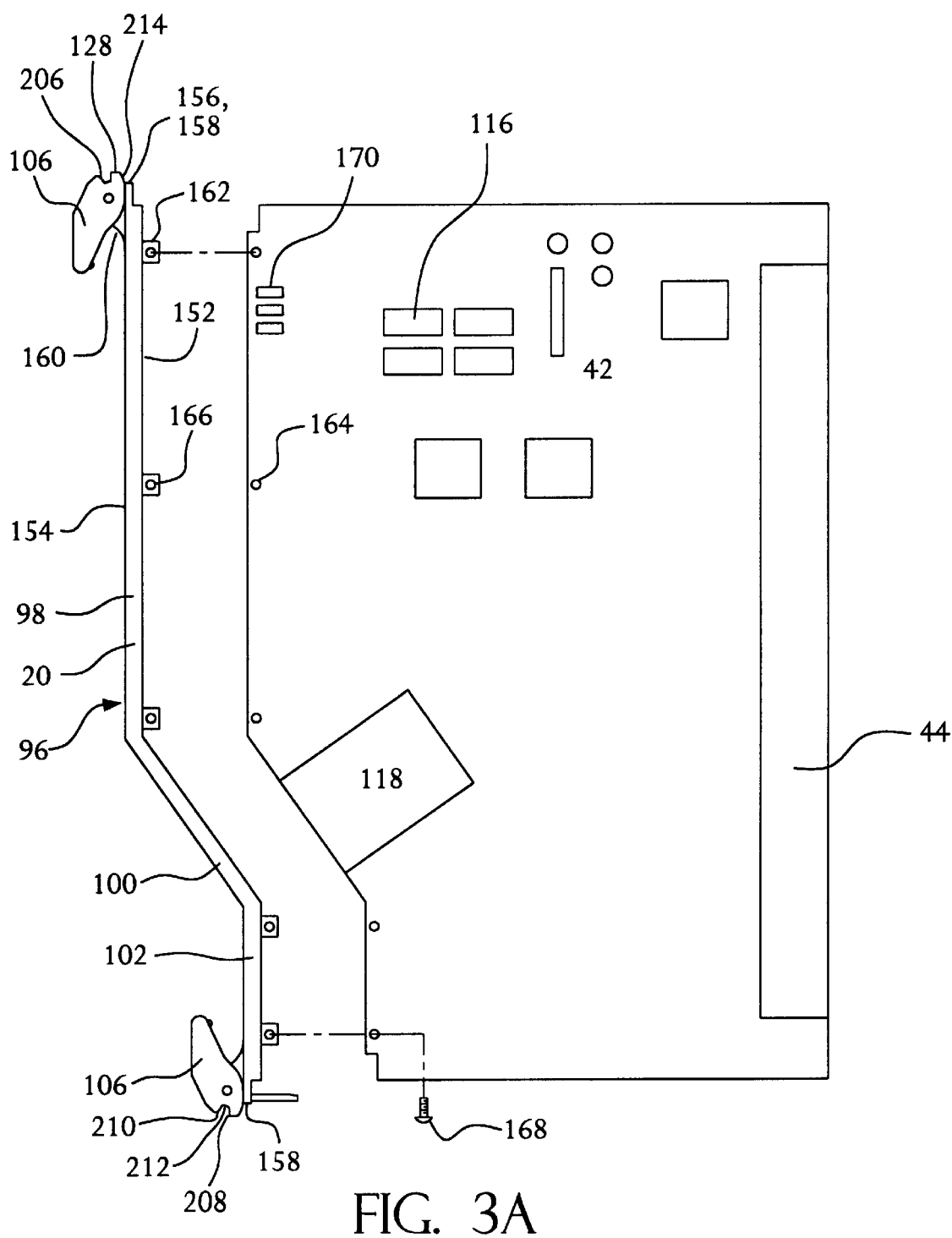
FIG. 3A is a side view of a printed circuit board with a face plate exploded away.

Referring to FIG. 3A, the face plate 20 and a printed circuit board 42 are shown exploded away from each other. The face plate 20 has three planar portions 96 wherein the first and third planar portions 98 and 102 are parallel and offset from each other. The interposed second planar portion 100 projects at an angle from the first planar portion 98 to the third planar portion 102 to create such offset. The planar portions 96 have an inner surface 152 which faces the printed circuit board 42 and an outer surface 154. The edge portion 156 of the first planar portion 98 and the third planar portion 102, the portion not adjacent to the second planar portion 102, define a free end 158.

Figure 3B:
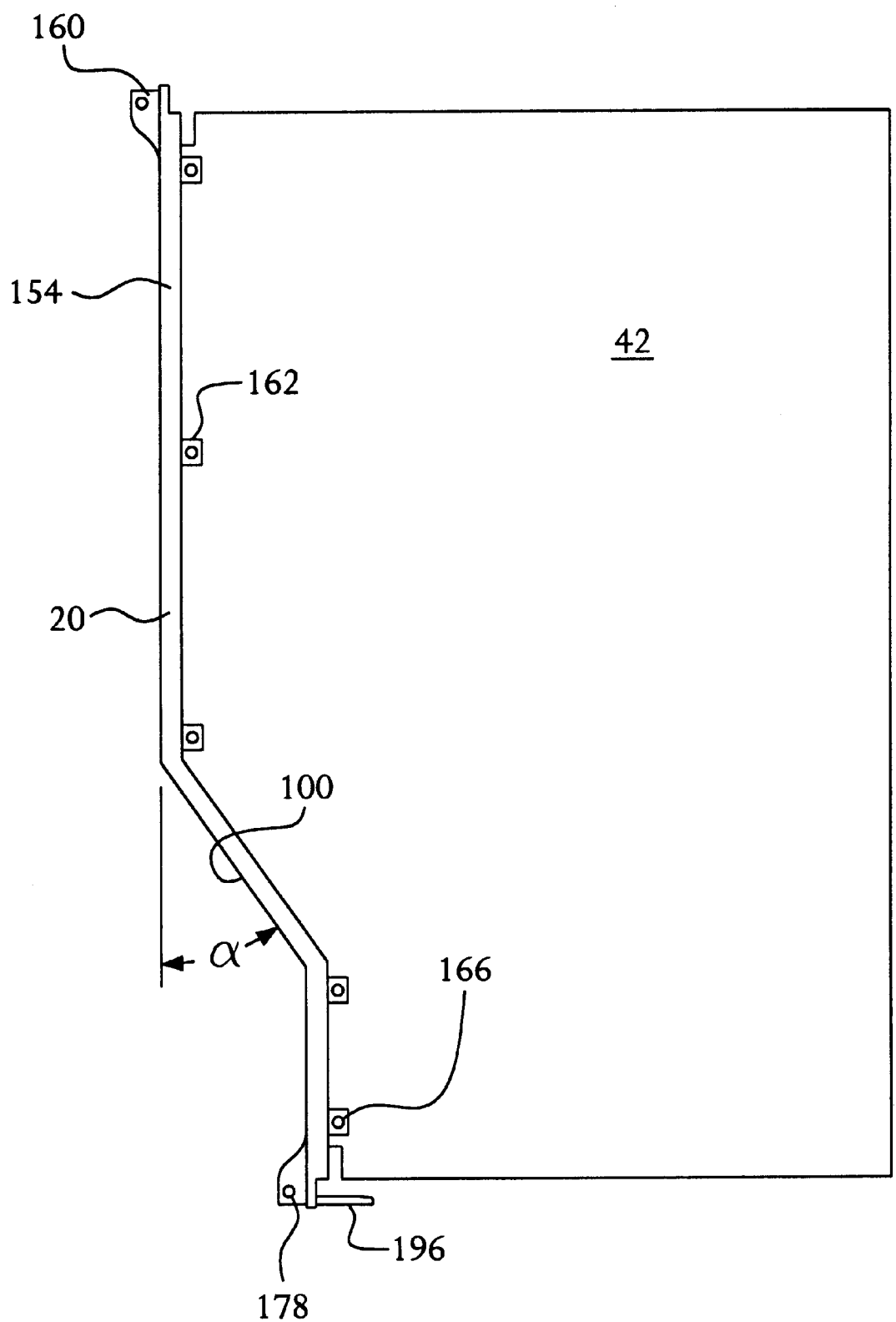
FIG. 3B is a side view of the printed circuit board with the face plate attached.

Located at the free ends 158 of each of the first and third planar portions 98 and 102 is a protrusion 160 on the outer surface 154 as best seen in FIGS. 3B and 4. Each protrusion 160 receives one of the ejectors 106 as explained in further detail below with respect to FIG. 4. The face plate 20 has a plurality of mounting features or bosses 162 formed integral on the inner surface 152 of the planar portions 96. The printed circuit board 42 has holes 164 aligned with the holes 166 in the bosses 162 such that a fastener 168, such as a screw, may secure the printed circuit board 42 and the bosses 162 of the front plate 20 to each other. With the use of five connection points, the force transferred between the face plate 20 and the printed circuit board 42 is more evenly distributed. The HDM female module interface 44 is shown on the printed circuit board 42. In addition, a plurality of components 116 are shown on the printed circuit board 42 including an optical transceiver 118 and a plurality of light emitting diodes (LEDs) 170.

Referring to FIG. 3B, the face plate 20 is shown attached to the PCB 42. The fasteners 168 extend through the PCB 42 into the holes 166 in the bosses 162. The second planar portion 100 is at angle α of between 25° to 55° and in a preferred embodiment the angle α is 35°.

Figure 4A:
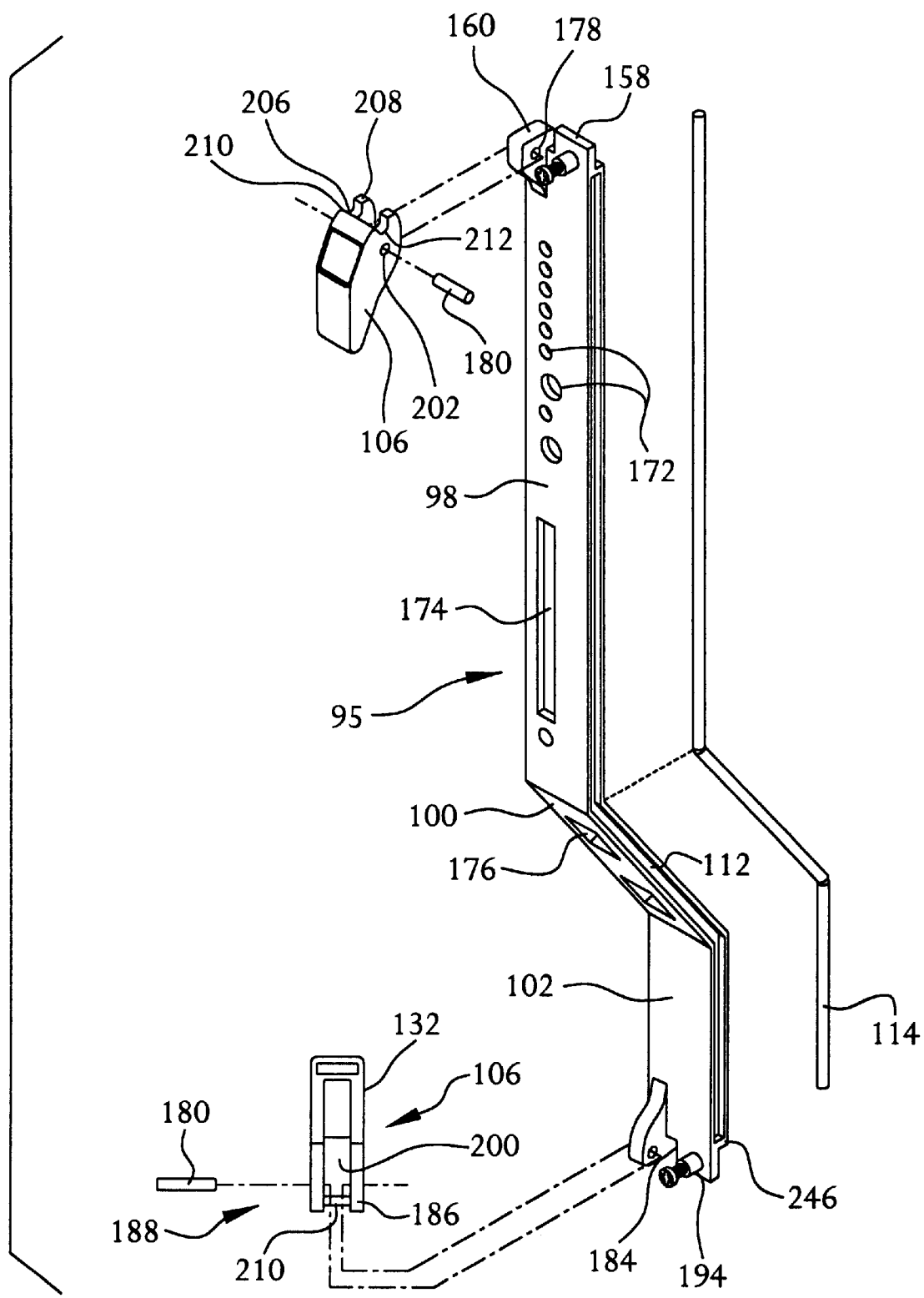
FIG. 4A is a front perspective view of the face plate with the ejectors exploded away.

Referring to FIG. 4A, a face plate 20 for use with a printed circuit board 42, not shown in this figure, having different components than those shown in FIG. 3, is shown in perspective with the ejectors 106 exploded away. The face plate 20 has a plurality of openings 172 on the first planar portion 98 for light channels, such as the light channels 144 shown in FIG. 2, which project the light from a LED mounted on the printed circuit board 42 to the outside of the face plate 20. The panel 98 in addition has a slot 174 through which a PCMCIA card reader extends outward. The second planar portion 100 has a pair of slots 176 through which pin connectors such as a standard series nine pin connector jack may extend from the printed circuit board 42.

Figure 4B:
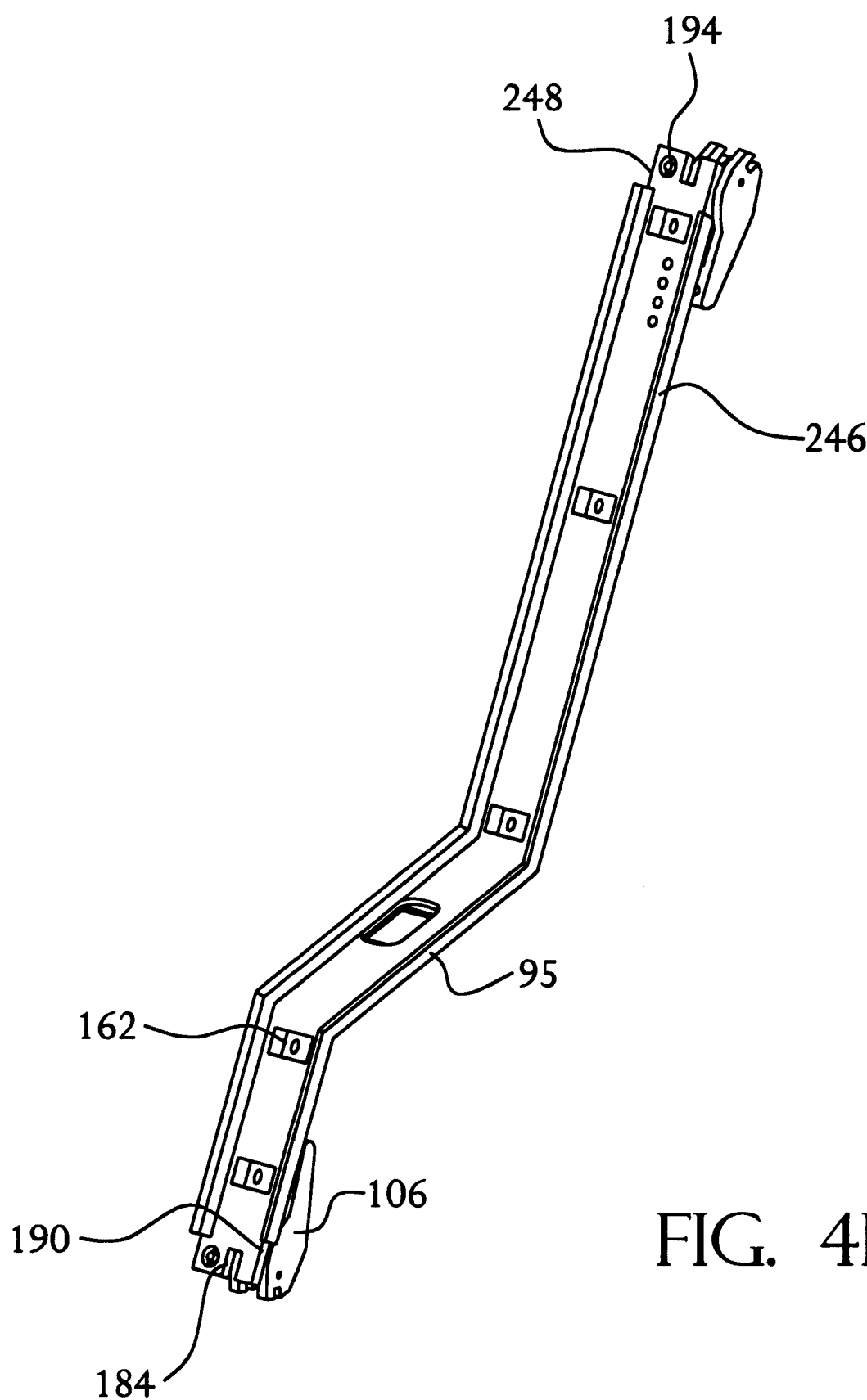
FIG. 4B is a rear perspective view of the face plate.

The protrusions 160 located at the top of the first planar portion 98 and the bottom of the third planar portion 102 in proximity to the free end 158 each have a hole 178. A pivot pin 180 extends through the hole 178 allow pivotal movement of the ejector 106 relative to the face plate 20. Located on one side of each of the protrusions 160 is a slot 184 in the planar portion 98. The slots 184 receive a planar portion 186 of an engaging portion 188 of the ejector 106 to allow movement of the ejector 106 (The ejector 106 is generally defined as having the engaging portion 188 and the handle portion 132). Located on the other side of the protrusion 160 near the side edge is a notch 190 in the planar portion 98 which receives the other planar portion 186 of the ejector 106 as best seen in FIG. 4B. Each of the ejectors 106 takes approximately one half of the width of the planar portion 98 of the frame 95 of the face plate 20.

The frame 95 of the face plate 20 has a captive fastener 194 located adjacent to the ejector 106 on the other half of the planar portion width. The captive fastener 194 is sometimes referred to as a floating screw.

In a preferred embodiment, selected face plates 20 can have an alignment pin 196 such as seen in the bottom of FIG. 3B, projecting from the inner surface 152 of the frame 95 for alignment with an alignment hole 198, such as seen in FIG. 5, on the anchor surface 62. The alignment pin 196, sometimes referred to as identifying pin, and the respective alignment hole 198 located on the anchor surface 62, can be positioned in various locations, such as only on the upper end, only on bottom, both, shifted to the left, right, etc. so that the improper printed circuit board 42 and associated face plate 20 are not installed into the wrong slot. In this preferred embodiment, it is recognized that only one or a few face plates 20 would have the alignment pin 196. It is recognized that the interface 44 to interface 46 of PCB 42 to the backplate 48 can incorporate alignment devices also to insure the proper circuit board 42 and face plate 20 are installed.

The ejector 106, as seen in FIG. 4A, has a handle portion 132 and an engaging portion 188, as indicated above. The bottom ejector 106, as seen in FIG. 4A, is rotated to better show the two planar portions 186 spaced by an opening 200 of the engaging portion 188. Each planar portion 186 of the engaging portion 188 is carried by the handle portion 132 and has a hole 202. The holes 202 are aligned with the hole 178 on the protrusion 160 of the frame 95 when the ejector 106 is installed. The pin 180, which pivotally connects the ejector 106 to the frame 95, is in a preferred embodiment a steel rail. The pin 180 is shown exploded away from the ejector 106 and the protrusion 160 on the outer surface 154 of the frame 95 of the face plate 20. The pin 180 extends between the two holes 202 in the ejector 106 and through the hole 178 in the protrusion 160 of the frame 95. The hole 178 of the protrusion 160 is a clearance hole to allow the pin 180 to rotate within this hole 178 of the protrusion 160. The pin 180 is press fit within the holes 202 of the planar portions 186 of the engaging portion 188 of the ejector 106 of the face plate 20.

As indicated above, one of the planar portions 186 of the engaging portion 188 of the ejector 106 passes through the slot 184 and the other planar portion 186 extends through the cut away or notch 190 in the frame 95 of the face plate 20 and an adjacent face plate 20. Each of the planar portions 186 of the engaging portion 188 has a notch 206 formed with a front engaging surface 208, the back engaging surface 210, and a bottom stop surface 212. The top of each of the notches 206 is open. The back engaging surface 210 extends between the two planar portions 186. In addition, each of the planar portions 186 has a front surface 214. The front engaging surface 208 and the front surface 214 define the tooth 128. The tooth 128 interacts with the ejector rail 68, as seen in FIG. 6, and further described below.

The frame 95 of the face plate 20 has a flange 246 on each of the side edges 248 that extends along a majority of the side edge 238, as best seen in FIG. 4B. Referring back to FIG. 4A, the frame 95 of the face plate 20 has the groove 112 formed along the one side for receiving the compressible metallic strip 114. The groove 112 is formed in the flange 236. The compressible metallic flexible strip 114, which is shown exploded away from the face plate, fills the gap between adjacent face plates to form a continuous electromagnetic shield. The compressible strip 114 is shown in three segments which abut each other and in a preferred embodiment are glued into the groove 112. The metallic strip 114 in a preferred embodiment is a wire mesh or wire covered nylon yard over a foam core, such as soft-shield® 2000 sold by Chomerics. The flexible strip 114 compresses when mated with the adjacent face plate 20, or housing.

The board, the printed circuit board (PCB) 42 or the air impedance module board 22, is slid into the modular rack 26 such that the upper and lower edges of the board are received by the rails 56 formed on the upper and lower cages 50 and 52, which are located above and below the printed circuit board area of the rack 26. When the board is nearly completely in, the ejector 106 is rotated such that the notch 206 is positioned so that the notch 206 opens towards the rail, the ejector rail 68, and the ejector 106 is extending generally outward as seen in FIG. 5.

With the ejector 106 in this position, the board and face plate 20 can be slid into a position where the bottom stop surface 212 of the notch 206 engages the outer surface 218 of the rail 68, and the teeth 128 on the ejector 106 are located underneath the rectangular openings 130 in the ejector rail 68. With both ejectors 106 in this position and a printed circuit board 42 nearly installed, the user rotates the handle portion 132 of the ejector 106 towards the frame 95 of the face plate 20 to a position such as seen in FIG. 6 therein forcing the board and face plate 20 into the closed position by the force of the tooth 128 against the surface of the opening 130 on the ejector rail 68. This rotation of the ejectors 106 also results in the seating of the interface 44, such as a HDM female module on the printer circuit board 42 into the interface 46, such as a HDM male backplane connector on the backplate 48, such as seen in FIG. 7. The anchor surface 62 in addition to positioning the face plate 20 structural, is a part of the chassis ground path.

To remove the board and the face plate 20 from the modular rack 26, chassis, the captive fasteners 194 are unscrewed and the handle portion 132 of the ejectors 106 are rotated away from the frame. The rotation of the ejectors 106 against the ejector rail 68 causes the board to unseat from the back plate 48.

Referring to FIG. 7, a sectional view of the modular rack 26 is shown. The printed circuit board 42 shown has an optical transceiver 118 adjacent to the face plate 20. The optical transceiver 118 has an exit port 220 which projects through an opening 120 in the second planar portion 100. With the tight tolerances that are possible with the die cast frame 95 of the face plate 20, the optical transceiver 118 can interface directly through the opening 120 without an intermediate jack or interface 120, such as shown in FIG. 1, which seats on the frame 95 of the face plate 20 and which would require connectors and interfaces. It is recognized in certain embodiments it may desirable to locate the optical transceiver 118 away from the opening, so that EMI which may radiate from the exit port 220 of the optical transceiver 110 is distant from the opening 120.

The printed circuit boards 42 each have an interface 44, such as a HDM female module, which is seated in an interface 46, such as an HDM male backplane connector on the backplate 48 to provide power to the components, such as the optical transceiver 118, and electronically connect those components to other components.

A fiber optics cable 222 extending from the optical transceiver 118 is routed through a slot 76 located in the housing 28 into the cable channel or trough 70. The cable 222 is routed through the openings 72 on the side of the housings.

Still referring to FIG. 7, underlying the cable channel or trough 70 is the duct 148 from the holes 90 on the front 30 and side 32 of the housing 28 to the plenum 150 behind the cable channel 70. Air which is drawn from outside the housing 28 passes through the duct 148 and plenum 150 and is then drawn through the lower cage 52, passes by and cools the printed circuit board 42 and passes up through the upper cage 50. The housing 28 receives a filter 228, which seats at the upper edge of the duct 148 and extends into the plenum 150 to filter particles out of the air prior to passing over the printed circuit board 42. The filter 228 also acts as a diffuser to create a more uniform air flow.

The fan casing or tray 80 is located above the upper cage 50. The fan casing 80 has a plurality of fans 82 which are each driven by a motor 138. The air drawn through the housing 28 and the fans 82 is forced out the holes 92 on the side 32 and the back 38 of the housing 28 near the top of the housing 28, which is sometimes referred to as "evacuation style cooling." The fan faceplate or bezel 86 is located in front of the fan casing 80 to give a finished look.

In a preferred embodiment, the frame 95 of the face plate 20 is formed of a metal, such as Zinc-Alloy (ZA-12) in a die-cast process. In a preferred embodiment, the ejector 106 is also formed of Zinc-Alloy (ZA-12). The use of die-cast face plates 20 allows a high tolerance of the frame 95 of the face plates 20 therein minimizing any gaps between adjacent planer portions 98 of adjacent frames 95 of adjacent face plates 20. In addition, in view of the increased precision for example of the second planar portion 100 relative to the remaining portions of the face plate 20 including the other planar portions 98 and 102 of the frame 95, those openings created in the frame 95 of the face plate 20, which are formed by secondary machining operation, to allow components such as pin connections to extend through the face plate 20 are more accurately positioned. These accurately positioned openings therefore do not need to be oversized, therein minimizing the possibility of electromagnetic interference waves passing through openings.

In a preferred embodiment, the mounting bosses 162 are formed in the die-cast process with a slight taper to facilitate removal of the frame 95 of the face plate 20 from the mold. The mounting bosses 162 are machined to form a surface to abut the PCB 42 of the air impedance module 22. Likewise, the groove 112 in the flange 236 for the metallic seal 114 is machined and holes 178 in the protrusions 160 are drilled after the part is die-cast.

The modular rack 26 with the tight tolerance face plate 20 and the metallic compressible strip 114 compressed between face plates 20 and between the end face plates 20 and side of the opening 54 prevents electromagnetic interference waves from passing through the opening 54. The interface of the top and bottom of the frame 95 with the stop plates 52 and the ejectors 106 with the ejector rails 68 likewise prevent openings through which EMI may pass.

The arrangement of other components as addressed above likewise limits EMI emission. In addition, the holes or openings in the housing 28 and in the card guides 50 and 52 are sized in addition to prevent insertion of adult size fingers through the openings.

Referring to FIG. 8, the fan casing or tray 80 is shown in exploded view. The fan casing 80 has a metal housing 230 that slides into the fan opening 84 in the housing 28, as seen in FIG. 7. The metal housing 230 has a bottom frame 232 with a plurality of curvilinear slots 234 that position in three sets under the fan blades 136 of the three fans 82. The portion of the bottom frame 232 is solid underlying the hub of the fan for fire protection purposes. Each of the fans are driven by a DC motor located within the hub of the fan 82 in a preferred embodiment.

An upper frame 236 of the metal housing 230 has a plurality of openings 238. The fan casing or tray 80 has an interface 240 and a control card 242. A pair of rails 244 for sliding the tray 80 into the housing 28 are shown exploded away.

Metallic seals, such as the compressible metallic seals 114, can be carried on the housing 230 of the fan tray 80 to engage the housing 28 to minimize EMI emission. However, the position of the fan tray 80 relative to the components, the interposed caged guide 50 and the geometry of the fan tray 80 results in reduced emission of EMI.

Referring back to FIG. 1, with the components 116 on the printed circuit boards 42 in the modular rack 26 operating and the face plates 20 covering the opening 40, which allows access to the printed circuit boards 42, to reduce any electromagnetic interference being generated by the components 116 within the modular rack 26 from escaping from the rack 26, these same components 116 are generating heat, which builds up in the rack 26 if not addressed. The fans 82 located in the fan casing or tray 80 are drawing air from the bottom portion of the modular rack 26 and sending it out the exit ports/holes 92 located on the upper portion of the modular rack 26. It is recognized that such airflow would take the path of the least resistance. The modular rack 26 in a preferred embodiment may have spaces to receive a plurality of cards, such as fifteen printed circuit board 42 in the embodiment shown. It is recognized that in many configurations, not all those fifteen slots will be filled with printed circuit boards 42 having components 116 in that this number of cards or components are not necessary for the use of the rack 26 at that time. If the printed circuit board 42 is not located within a rack 26, the open space will create a path of least resistance for the airflow to pass from below the lower cage 52 to above the upper cage 50. In such circumstances, the narrow space between two printed circuit boards 42 which has components additional filling the space receive minimal airflow. Even a blank card, which is lacking components, creates less air resistance than a filled circuit board 42 and the air will flow past the blank cards.

Figure 9:
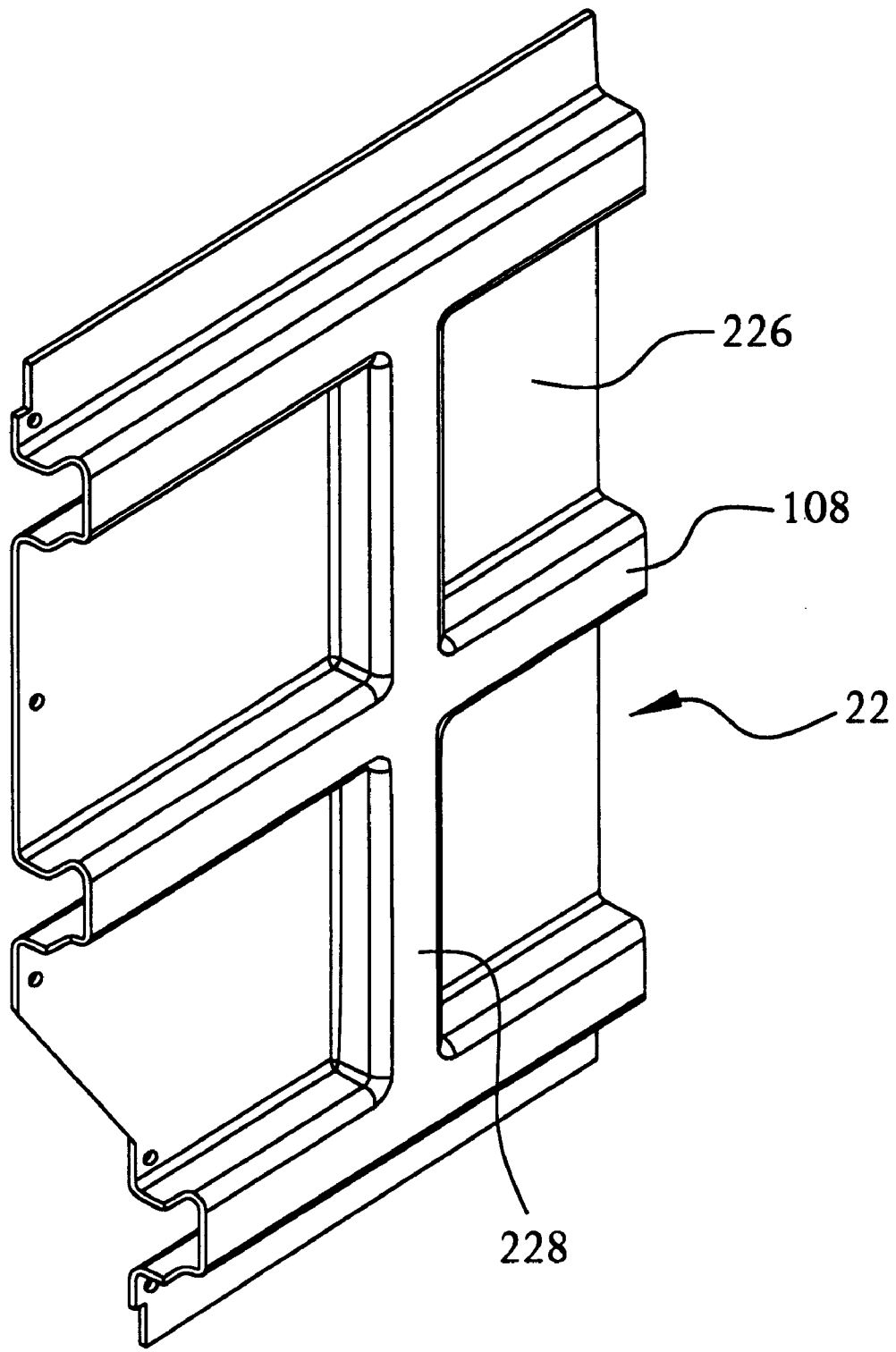
FIG. 9 is a perspective view of an impedance board.

Referring to FIG. 9, an isometric view of the air impedance module 22 is shown. The air impedance module 22 has similar mounting connections as that of a printed circuit board 42 for connecting to the face plate 20. The air impedance module 22 has three protrusions/ribs 108 which project off the plane 226 to block airflow.

In addition to the three protrusions 108, the air impedance module 22 has a vertical stiffener 228 which extends between the top and bottom ribs. The vertical stiffener 228 is to provide mechanical stiffness to minimize vibration and has a minimum effect on restricting flow, since the air flow is in the same direction.

Figure 10:
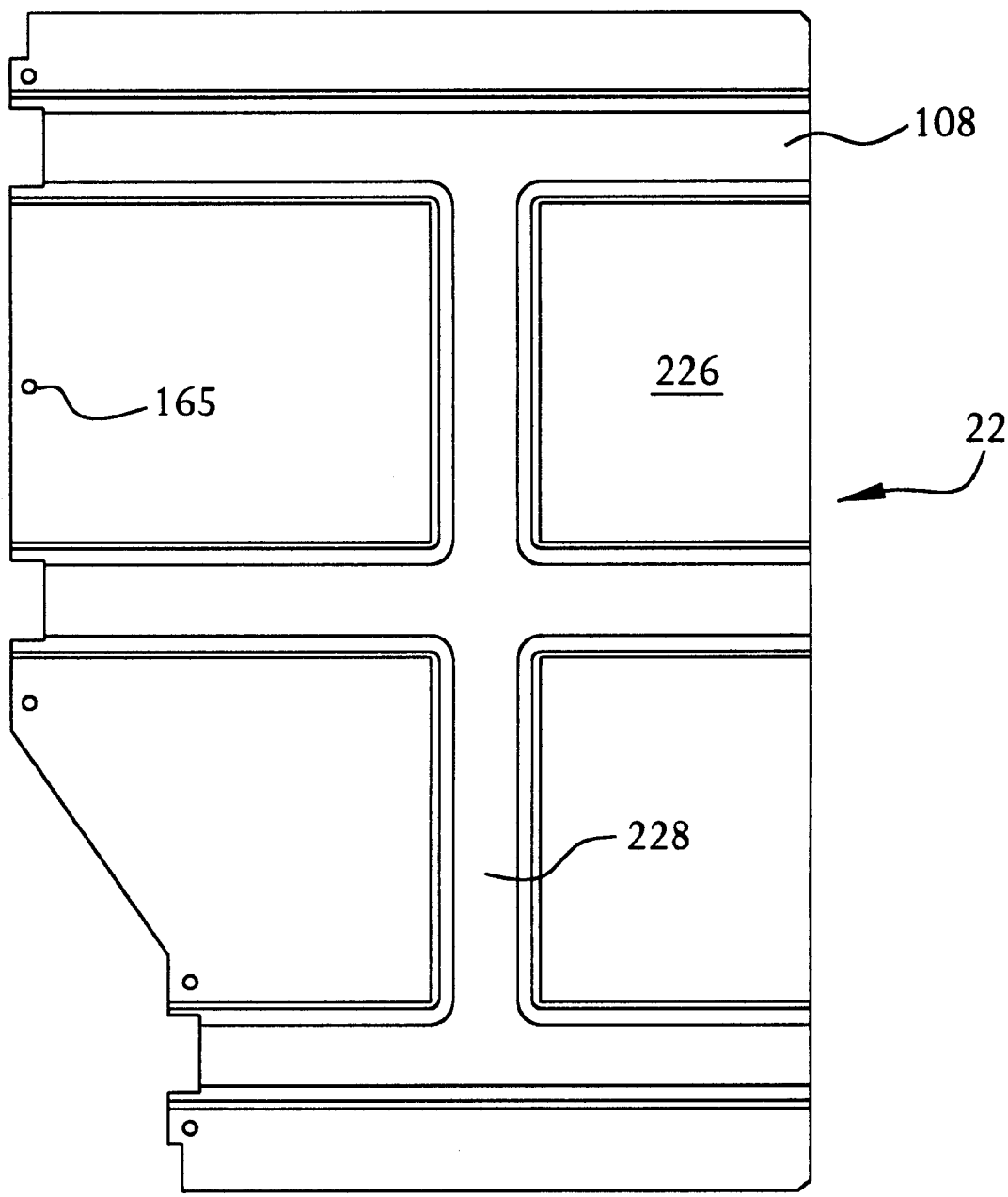
FIG. 10 is a front view of the impedance board of FIG. 9.
Figure 11:
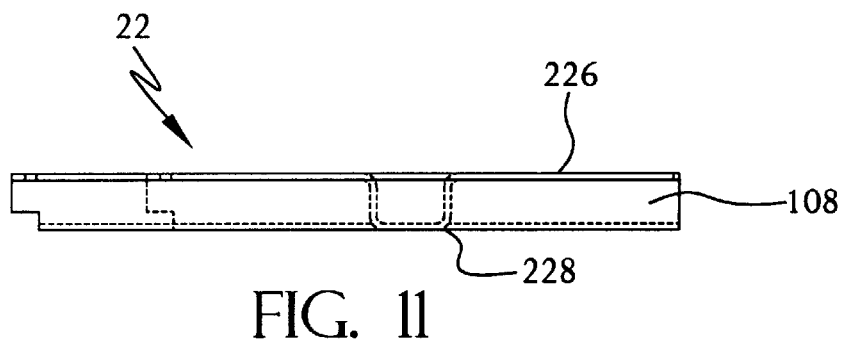
FIG. 11 is a side view of the impedance board of FIG. 9.
Figure 12:
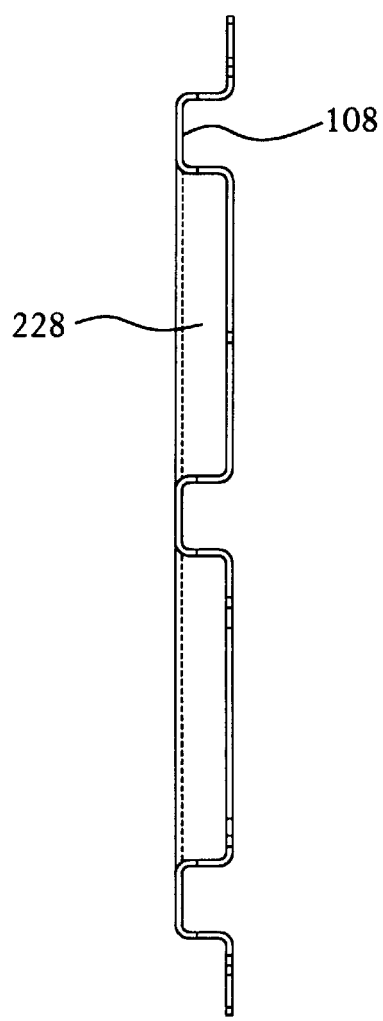
FIG. 12 is a top view of the impedance board of FIG. 9.

Referring to FIGS. 10–12, the air impedance module 22 has the plane 226 with a plurality of protrusions 108. In a preferred embodiment, the air impedance module 22 has three protrusions or ribs 108. The protrusions 108 do not extend all the way to the front edge, as best seen in FIGS. 10 and 11, so that the air impedance module 22 does not interfere with the flange 246, EMI gasketing flange, on the face plate 20. The vertical stiffener 228 of the air impedance module 22 stiffens the plane.

The holes 165 in the plane 226 are positioned at the same location as those holes 164 on the PCB 42 in a preferred embodiment. The face plate 20 can secure to the air impedance module 22 using the mounting blocks 162, such as seen in FIGS. 3 and 7.

The air impedance module 22 is formed in a preferred embodiment of thermoform plastic, preferable a flame retardant (UL94V-O rated material) thermoform plastic such as Kydex-T.

While this invention has been particularly shown and described with references to preferred embodiments thereof, it will be understood by those skilled in the art that various changes in form and details may be made therein without departing from the scope of the invention encompassed by the appended claims.

What is claimed is:

1. A face plate for a printed circuit board comprising:
   an elongated frame having at least two planar body portions each having a pair of planar surfaces, an outer surface and inner surface, and a pair of side edges, the planar body portions integrally formed to each other, the planes of the two planar body portions at an angle of between 25 and 55 degrees of each other, the elongated frame having a pair of free edges adjacent to the planar surfaces and the pair of side edges; and
   a pair of mounting devices, each mounting device carried by the elongated frame in proximity to one of the free edges, the pair of mounting devices offset from each other about the planar body portions.

2. The face plate of claim 1 further comprising an opening on one of the planar body portions adapted to receive an optical interface.

3. The face plate of claim 1 further comprising an opening on one of the planar body portions adapted to receive an electrical interface.

4. The face plate of claim 1 further comprising a plurality of mounting bosses carried on the inner surface of at least one of the planar body portions adapted for attachment to a front edge of the printed circuit board.

5. The face plate of claim 1 wherein the mounting devices include at least one ejector pivotably mounted to the face plate adapted for seating and securing the face plate to a chassis.

6. The face plate of claim 5 wherein the planar portion of the elongated frame has a integral protrusion on the outer surface for pivotably receiving the ejector.

7. The face plate of claim 1 wherein the elongated frame of the face plate is die cast.

8. The face plate of claim 7 wherein the mounting devices include at least one die cast ejector and wherein the planar portion of the elongated frame has an integral die cast protrusion on the outer surface for pivotably mounted the ejector adapted for seating and securing the face plate to a chassis.

9. The face plate of claim 8 wherein one of the side edges of the planar portion has a groove and further comprising a metallic seal carried in the groove adapted for sealing with adjacent surfaces.

10. The face plate of claim 9 wherein the frame of the face plate has a flange on the side edges which carries the groove which receives the metallic seal.

11. A card unit for insertion in a chassis, the card unit comprising:
    a board having a planar plate portion with a pair of planar surfaces and a plurality of edges including an upper edge and lower edge each adapted to be received in a guide, a back edge and at least a pair of front edges, the pair of front edges adjacent to each other and not parallel;
    a face plate including an elongated frame having at least two planar body portions each having a pair of planar surfaces, an outer surface and inner surface, and a pair of side edges, the planar body portions integrally formed to each other, the planes of the two planar body portions at an angle in the range of 25 and 55 degrees between each other, the elongated frame having a pair of free edges adjacent to the planar surfaces and the pair of side edges, and a pair of mounting devices, each mounting device carried by the elongated frame in proximity to a free edge, the pair of mounting devices offset from each other about the planar body portions.

12. The card unit of claim 11 wherein the mounting devices of the face plate each further comprises an ejector.

13. The card unit of claim 12 wherein the face plate further comprises a plurality of mounting bosses carried on the inner surface of at least one of the planar body portions for attachment to the front edge of a printed circuit board.

14. The card unit of claim 13 wherein the board is a printed circuit board having a plurality of components including an interface adjacent to the back edge adapted for interfacing with a back plane in the chassis, and at least one component adjacent to the front edge, and the face plate has at least one opening for granting access to the component on the printed circuit board.

15. The card unit of claim 14 wherein the elongated frame of the face plate is die cast, the at least one component adjacent to the front edge of the printed circuit board is an optical transceiver and wherein the at least one opening is on the angular planar body portion and the optical transceiver engages the inner surface of the planar body allowing access but limiting EMI emissions.

16. The card unit of claim 12 wherein the board is a blank card having at least one raised portion adapted for limiting air flow.

17. A chassis for an electronic system, the chassis comprising:
    a housing having a plurality of walls defining an interior space, one of the walls having an opening to an interior space of the chassis;
    a pair of card guides carried by the housing, one of the guides in proximity to the top edge of the opening and the other guide in proximity to the bottom edge of the opening, each card guide having a plurality of openings to allow air to pass through the guide and a plurality of guide channels;
    the housing forming a trough adapted to receive optical cables, the housing having at least one opening into the trough for allowing the cables to pass through;
    a door panel hingedly secured to the housing for granting access to the trough;
    a back panel carried by the housing, the back panel having a plurality of interfaces;
    a pair of ejector rails having a plurality of openings, one of the rails located in proximity to the top edge of the opening and the other rail in proximity to the bottom edge;
    a pair of anchor surfaces; each of the anchor surfaces in proximity to one of the ejector rails;
    a plurality of circuit boards, each circuit board having a planar plate portion with a pair of planar surfaces and a plurality of edges including an upper edge and lower edge adapted to be received in one of the guide channels in one of the card guides, a back edge and at least a pair of front edges, the pair of front edges adjacent to each other and not parallel; and a plurality of face plates, each face plate including an elongated frame having at least two planar body portions each having a pair of planar surfaces, an outer surface and inner surface, and a pair of side edges, the planar body portions integrally formed to each other, the planes of the two planar body portions at an angle of between 25 and 55 degrees to each other, the elongated frame having a pair of free edges adjacent the planar surfaces and the pair of side edges, and the face plate including a pair of mounting devices, each mounting device carried by the elongated frame in proximity to the free edge, the pair of mounting devices offset from each other about the planar body portions, at least one of the mounting devices including an ejector and wherein the planar portion of the elongated frame has a protrusion on the outer surface for pivotably mounting the ejector, and the face plate has a plurality of printed circuit mounts carried on the inner surface of at least one of the planar body portions for attachment to the front edge of the circuit board.

18. The chassis of claim 17 wherein the face plates are die cast.

19. The chassis of claim 18 wherein the housing has a groove on one of the sides of the opening and each of the front panels having a groove on a side and further comprising a metallic seal in each of the grooves for sealing with adjacent surfaces.

20. The chassis of claim 19 further comprising at least one captive fastener carried on each of the face plates and a threaded opening on the anchor surface for accepting the captive fastener.

21. The chassis of claim 20 further comprising an alignment pin projecting from the inner surface of at least one of the face plates, the anchor surface having an opening for receiving the alignment pin, the position of the alignment pin and accepting opening determining what face plate and associated printed circuit board are accepted.

22. The chassis of claim 21 further comprising a fan tray, the fan tray having at least one fan for moving air through the chassis, the fan tray carried in a fan tray opening in the housing.

23. The chassis of claim 22 wherein at least one of the printed circuit boards has a plurality of components including an interface adjacent to the back edge for engaging one of the interfaces on the back panel and an optical transceiver carried adjacent to the front edge, and the face plate has an opening on the angular planar body portion, the optical transceiver having an interface port aligned with the opening on the face plate, and the optical transceiver engages the inner surface of the planar body.

24. The chassis of claim 18 comprising at least one board for insertion in a chassis for controlling air flow in the chassis, the board comprising:

a planar portion having a pair of sides and a plurality of edges and the top and bottom edges adapted to be received in the chassis; and a plurality of air impedance protrusions formed integrally with the planar portion and protruding from the planar portion on the same side for limiting the flow of air, and a stiffener protrusion projecting generally non-parallel to the air impedance protrusion.

25. The chassis of claim 24 further comprising a fan tray, the fan tray having at least one fan for moving air through the chassis, the fan tray carried in a fan tray opening in the housing.

26. The chassis of claim 17 further comprising at least one board for insertion in a chassis for controlling air flow in the chassis, the board comprising:

a planar portion having a pair of sides and a plurality of edges and the top and bottom edges adapted to be received in the chassis; and a plurality of air impedance protrusions formed integrally with the planar portion and protruding from the planar portion on the same side for limiting the flow of air, and a stiffener protrusion projecting generally non-parallel to the air impedance protrusion.

27. The chassis of claim 26 further comprising at least one captive fastener carried on each of the face plates and a threaded opening on the anchor surface for accepting the captive fastener; and an alignment pin projecting from the inner surface of at least one of the face plates, the anchor surface having an opening for receiving the alignment pin, the position of the alignment pin and accepting opening, determining what face plate and associated printed circuit board are accepted.

28. The chassis of claim 27 wherein the face plate is die cast and the housing has a groove on one of the sides of the opening and each of the front panels having a groove on a side and further comprising a metallic seal in each of the grooves for sealing with adjacent surfaces.

29. The chassis of claim 28 further comprising a fan tray, the fan tray having at least one fan for moving air through the chassis, the fan tray carried in a fan tray opening in the housing.

30. A face plate for inserting and extracting a a printed circuit board having a pair of sides and a mating connector with respect to a card cage with spaced support rails and a backplane connector for engaging, respectively, the sides of the printed circuit board and the mating connector at the rear of the printed circuit board, said face plate comprising:

a die cast elongated frame having three planar body portions, the second body portion interposed between the first and third body portions, the first and third planar body portions parallel and offset, the second body portion extending between and integral with the first and third body portions, the planar portion of the second portion at an angle between 25 and 55 degree from the planar portions of the first and third body portions; the first and third portions having a free edge opposite the second body portion;

a protrusion projecting from the free end of the first and third planar body portion on the outer surface, the protrusion having an opening;

a slot extending from the free ends in proximity to the protrusion;

a notch extending from the free end and a side edge;

an ejector pivotably attached to the protrusion of the planar body portion, the ejector having a pair of spaced teeth adapted to be received by an opening and a handle portion;

a plurality of integral mounting bosses extending from the inner surface of the frame of the face plate;

the planar portions having a plurality of openings for receiving connectors;

at least one of the openings being on the second planar portion;

an adapter carried by the second planar portion and adapted to pass cable through the frame of the face plate;

a captive fastener extending from the inner surface of the frame in proximity to one of the ends adapted to secure the front panel to the anchor surface.

31. The face plate of claim 20 further comprising at least one opening on the second planar portion and an alignment pin projecting from the inner surface of one of the planar body portions in proximity to one of the free edges.

32. A card unit for insertion in a chassis, the card unit comprising:

a face plate including a die case elongated frame having three planar body portions, the second body portion interposed between the first and third body portion, the first and third planar body portion, the planar portion of the second portion at an angle between 25 and 55 degrees from the planar portions of the first and third body portions, the first and third portions having a free edge adjacent to the planar surfaces and the pair of side edges; and an air impedance board of a flame retardant thermoform plastic including a planar portion having a pair of sides and a plurality of edges and the top and bottom edges adapted to be received in a chassis, and a plurality of air impedance protrusions formed integrally with the planar portion and protruding from the planar portion on the same side for limiting the flow of air.

* * * * *

UNITED STATES PATENT AND TRADEMARK OFFICE
CERTIFICATE OF CORRECTION

PATENT NO.    : 6,285,548 B1
DATED         : September 4, 2001
INVENTOR(S)   : Darrel J. Hamlet and Eric G. Franklin It is certified that error appears in the above-identified patent and that said Letters Patent is hereby corrected as shown below:

<u>Column 14,</u>
Line 28, delete "A face plate for inserting and extracting a a printed" and insert -- A face plate for inserting and extracting a printed --

<u>Column 15,</u>
Line 1, delete "The face plate of claim 20" and insert -- the face plate of claim 30 --

Signed and Sealed this

Twelfth Day of March, 2002

Attest:

JAMES E. ROGAN
*Attesting Officer*    *Director of the United States Patent and Trademark Office*